United States Patent
Baik

(10) Patent No.: US 6,466,448 B1
(45) Date of Patent: Oct. 15, 2002

(54) RISER BOARD RETAINING AND AIR DUCTING STRUCTURE FOR PRINTED CIRCUIT BOARDS

(75) Inventor: David Baik, San Jose, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 0 days.

(21) Appl. No.: 09/878,534

(22) Filed: Jun. 11, 2001

(51) Int. Cl.[7] ................................ H05R 5/00
(52) U.S. Cl. ................ 361/752; 361/753; 361/801
(58) Field of Search ................ 361/725–730, 361/753, 754, 756, 759, 794–802, 816, 818; 174/35 R, 35 GS

(56) References Cited

U.S. PATENT DOCUMENTS 3,848,953 A * 11/1974 Petroshanoff ............ 339/92 M
4,124,878 A * 11/1978 Ebner et al. ............... 361/415
5,214,572 A *  5/1993 Cosimano et al. .......... 361/415
5,734,551 A *  3/1998 Hileman et al. ........... 361/695
6,049,468 A *  4/2000 Learmounth ............... 361/816
6,157,540 A * 12/2000 Eddings et al. ............ 361/727

* cited by examiner

Primary Examiner—Kamand Cuneo
Assistant Examiner—Tuan Dinh
(74) Attorney, Agent, or Firm—John R. Ley

(57) ABSTRACT

Riser printed circuit boards are retained relative to a motherboard to avoid lateral side-to-side movement and vertical separation from an edge connector on the motherboard. A horizontal portion of a retaining plate extends above an upper edge of the riser boards, and a resilient compressible gasket is connected to the horizontal portion. The resilient compressible gasket contacts and upper edge of the riser boards, and applies resilient force to retain the riser boards. The retaining plate also ducts cooling air over heat-sensitive components of the motherboard and increases the air flow rate over those components by reducing the cross-sectional size of the path through which the cooling air flows.

33 Claims, 4 Drawing Sheets

RISER BOARD RETAINING AND AIR DUCTING STRUCTURE FOR PRINTED CIRCUIT BOARDS

This invention relates to electronic device component assemblies of the type having multiple riser printed circuit boards (PCBs) connected in a vertical orientation to a horizontally-extending main or mother PCB. More particularly, the present invention relates to a new and improved structure and method for retaining the vertically-oriented riser PCBs against vertical separation from an edge connector and from lateral side-to-side movement, as might occur during use, shipment or transportation. The present invention also relates to ducting cooling air over heat-sensitive electronic components to achieve improved cooling.

BACKGROUND OF THE INVENTION

Many electronic devices use a mother PCB known as a motherboard as a foundation upon which the other electronic components are attached and interconnected. The other electronic components typically include integrated circuit (IC) chips, microprocessors, memories, interfaces for communicating with external devices, and the like. Typically the motherboard contains the electronic components necessary to achieve the basic functionality of the electronic device. The motherboard is usually retained within a rigid cabinet or housing of the device. If the electronic functionality of the device is not overly complex, or if there is sufficient space within the cabinet or housing, the motherboard may be sufficiently large to retain and connect all of the electronic components necessary to achieve enhanced functionality beyond the basic functionality. In many cases however, it is necessary to enhance the functionality of the electronic device beyond the capability of the components of the motherboard. For example, computer motherboards usually have connectors to add additional memory chips and thereby increase the memory capacity of the computer.

Connecting an additional PCB to the motherboard enhances the functionality because of the increased functional capacity of the components of the additional PCB. Such additional PCBs are sometimes referred to as "riser boards," because riser boards typically extend at an angle perpendicular to the motherboard in order to utilize the space above the motherboard within the cabinet. The riser boards are connected to the motherboard by a conventional edge connector. The edge connector includes a multiplicity of individual electrical contacts and receptacles which receive and electrically connect to conductor pads formed along a bottom edge of the riser board. It is not unusual that from two to twelve edge connectors may be attached to the motherboard in order to connect a corresponding number of riser boards. When connected to the motherboard, the riser boards usually extend parallel to one another.

In addition to providing the opportunity to increase the functionality of the motherboard by connecting additional riser boards, the edge connectors allow the riser boards to be removed and replaced in relatively easy manner. The riser boards can be separated from the edge connectors by pulling the riser boards vertically away from the motherboard. The ability to easily remove and replace the riser boards is an advantage when it is desired to change the riser board to alter the functionality or capability of the electronic device, or to replace defective parts.

Because the riser boards extend perpendicularly with respect to the motherboard, it is necessary to support the riser boards to prevent them from lateral, side-to-side pivoting movement about a bottom edge connector. Electronic devices are subject to forces when they are transported, and some electronic devices that are incorporated in movable equipment are subject to continued forces from use of the device itself. Lateral pivoting movement of the riser boards has the potential of fatiguing the electrical edge connectors, which could result in electrical disconnection or breakage and consequent failure of the electronic components. The riser boards could also laterally tilt to contact one another and possibly create unintended electrical connections that would adversely affect the performance of the electronic device.

To retain the riser boards against the lateral side-to-side movement, it has been typical to use vertical card guides. Vertical card guides are positioned to retain the opposite vertically extending edges of each end of a full-length riser board. With the opposite vertical edges retained in the card guides, the riser board is prevented from pivoting in lateral side-to-side movement. However, the lengths of the riser boards may vary. Riser boards of three-fourths or half length are commonly used. Since the vertical card guides are set to accommodate only a full-length riser board, reduced-length riser boards cannot be supported at both vertically- extending opposite edges. Reduced-length riser boards can only be supported at one vertical edge by one vertical card guide. The other vertical edge cannot be supported, because the reduced-length of the riser board terminates the other vertical edge at a location separated from the location of the other vertical card guide. The other, unsupported edge is therefore free to move laterally with side-to-side movement. Consequently, reduced-length riser boards may not be adequately supported, and are subject to the risks of premature failure due to movement during, use transportation or shipping of the electronic device.

The vertical card guides also do not retain the riser boards against movement in a vertical plane away from the edge connector attached to the motherboard. Such vertical movement may also result from the vibration and motion associated with transportation or use. Sufficient vertical movement can disconnect the riser boards from the edge connectors on the motherboard, thereby disabling the functionality achieved by the riser board.

Another potential difficulty associated with electronic devices is ensuring adequate air flow to cool heat-sensitive electronic components. The position of the electronic components relative to the cooling air flow is critical, to assure adequate air flow over and cooling of those components. Positioning the heat-sensitive components relative to the airflow sometimes restricts the ability to utilize efficiently the available space of the motherboard to accommodate other less heat-sensitive electronic components. The vertically extending riser boards may tend to channel or direct the cooling air which normally flows over the motherboard.

The use of riser boards with motherboards in the manner described, and other background considerations, have given rise to the present invention.

SUMMARY OF THE INVENTION

One improvement of the present invention involves retaining riser boards relative to the motherboard in a manner which prevents lateral side-to-side movement and which retains the riser boards against vertical movement which would separate the riser board from its connection at the edge connector to the motherboard. Another improvement involves retaining the riser boards while preserving the advantages of the vertical orientation and edge connection that allows easy access to and removal of the riser boards. Another improvement of the present invention involves retaining the riser boards in the manner described while ducting cooling air flow to achieve enhanced cooling in locations where critical heat-sensitive and heat-generating electronic components of the motherboard are located. The present invention obtains these improvements without requiring the use of special tools to gain access to the riser boards for their removal and insertion or to retain the riser boards.

These and other improvements are achieved by a structure for retaining a vertically-extending riser board connected to an edge connector of a horizontally-extending motherboard of an electronic device. The riser board has an upper horizontal edge and the lower horizontal edge, and the lower horizontal edge is connected to the edge connector. The retaining structure comprises a plate having a horizontal portion, a resilient compressible gasket attached to the horizontal portion of the plate, and a positioning structure which locates the plate in a closed position relative to the riser board. In the closed position, the horizontal portion of the plate is located above the upper horizontal edge of the riser board to retain the riser board. The gasket is resiliently compressed against the upper horizontal edge of the riser board to retain the riser board against lateral side-to-side movement and against vertical movement. The lateral side-to-side movement of the riser board, which might fatigue or otherwise compromise the electrical connection at the edge connector, is avoided. Vertical movement of the riser board relative to the motherboard, which could disconnect the riser board from the edge connector, is also avoided.

The improvements of the present invention are also realized in a method of retaining the vertically-extending riser board against vertical and lateral side-to-side movement. The retaining method comprises the steps of connecting the riser board to an edge connector of the horizontally-extending motherboard of the electronic device, locating a plate having horizontal portion in a closed position relative to the riser board where the horizontal portion of the plate is above the upper horizontal edge of the riser board, and compressing a resilient gasket between the horizontal portion of the plate and the upper horizontal edge of the riser board to retain the riser board against vertical movement and against lateral side-to-side movement.

Preferable aspects of the retaining structure and retaining method involve locating the plate in open position where the horizontal portion of the plate and the gasket are laterally withdrawn to a non-interfering position to allow the riser board to be vertically inserted and removed from the edge connector. Preferably, the plate is pivotally attached at a location laterally separated from the riser board to pivot into the non-interfering open position and into the retaining closed position. The plate preferably includes a center portion which is pivotally connected at a location laterally separated from the riser board, and the horizontal portion extends from the center portion toward the riser board and pivots between the non-interfering open position and the retaining closed position.

Another preferable aspect of the retaining structure and the retaining method involves directing a cooling air flow over the motherboard and the riser boards. The plate includes a transition portion which extends between a center portion and horizontal portion, and the center portion is positioned vertically below the upper horizontal edge of the riser board. The transition portion extends from the center portion upwardly in the direction toward the riser board to the horizontal portion. A vertical dimension between the center portion and the motherboard defines a space through which the cooling air flows over the motherboard and the riser board. The motherboard includes heat-sensitive electronic components which are located adjacent to the space defined between the center portion and the motherboard. A smaller cross-sectional size of the space between the center portion and the motherboard increases the speed of the cooling air flow over the heat-sensitive components of the motherboard located within that space. Preferably, the plate also includes a baffle portion which extends into the cooling air flow to duct the cooling air flow into the smaller cross-sectional space to further enhance the cooling air flow through that space. After passing over the heat sensitive elements, the transition portion of the plate ducts the cooling air flow from the space into a flow path of increasing cross-sectional size.

Other preferable aspects of the retaining structure and retaining method involve simultaneously retaining a plurality of different-length riser boards. The length of each riser board extends in a horizontal direction between opposite vertically-extending end edges. The horizontal portion of the plate extends above the upper horizontal edge of the different-length riser boards to retain the different-length riser boards against vertical separation and lateral side-to-side movement. The retention force applied to the upper horizontal edge is not dependent on the length of the riser boards, and therefore accommodates a plurality of different-length riser boards without requiring a card guide connected to both vertically extending end edges of the two riser boards.

A more complete appreciation of the present invention and its scope may be obtained from the accompanying drawings, which are briefly summarized below, from the following detail descriptions of presently preferred embodiments of the invention, and from the appended claims.

DETAILED DESCRIPTION

Figure 1:
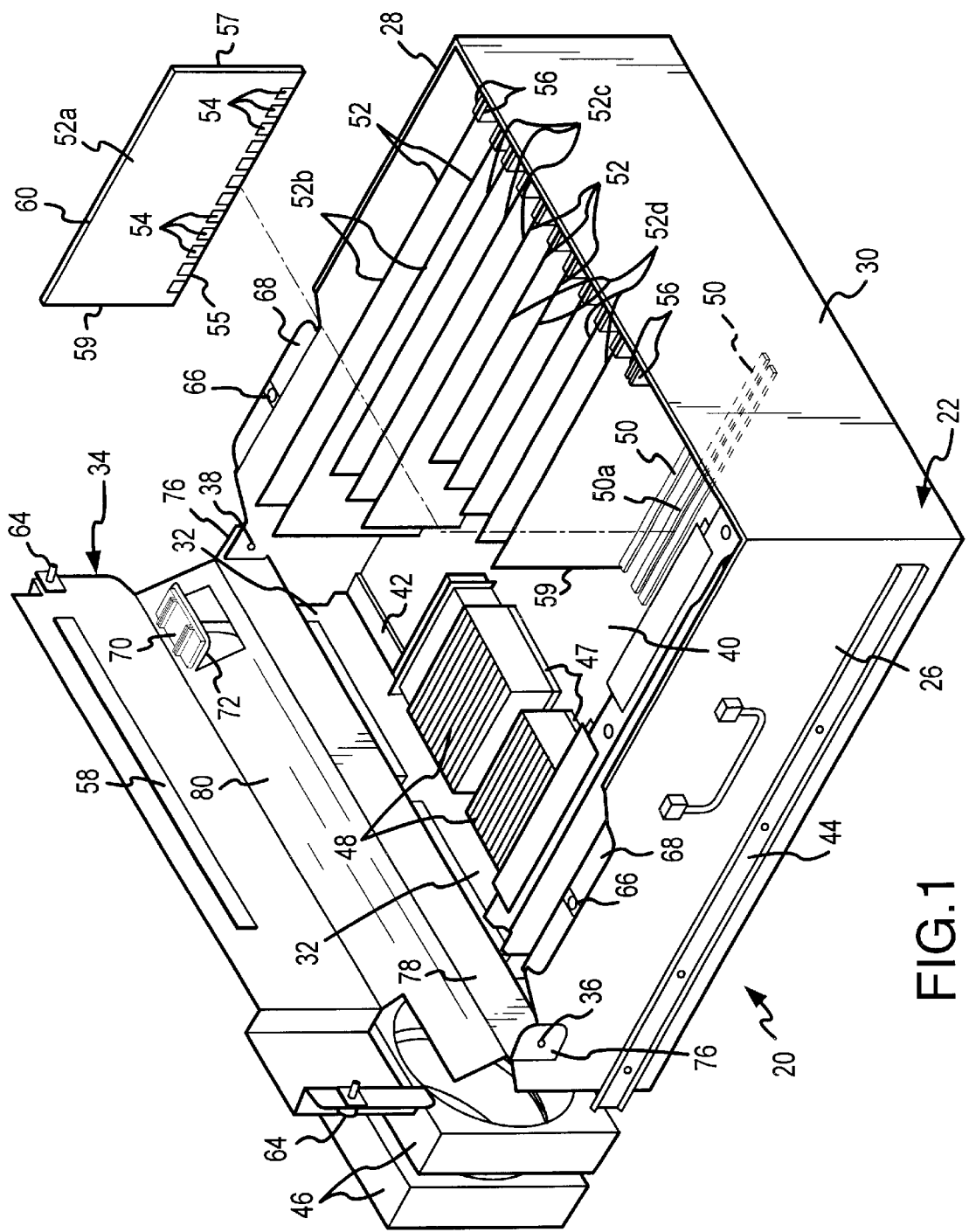
FIG. 1 is a perspective view of an electronic device which incorporates the present invention, showing a retaining and air ducting plate of the present invention in an open position, and also showing a riser board in exploded relationship relative to an edge connector attached to a motherboard of the device.
Figure 2:
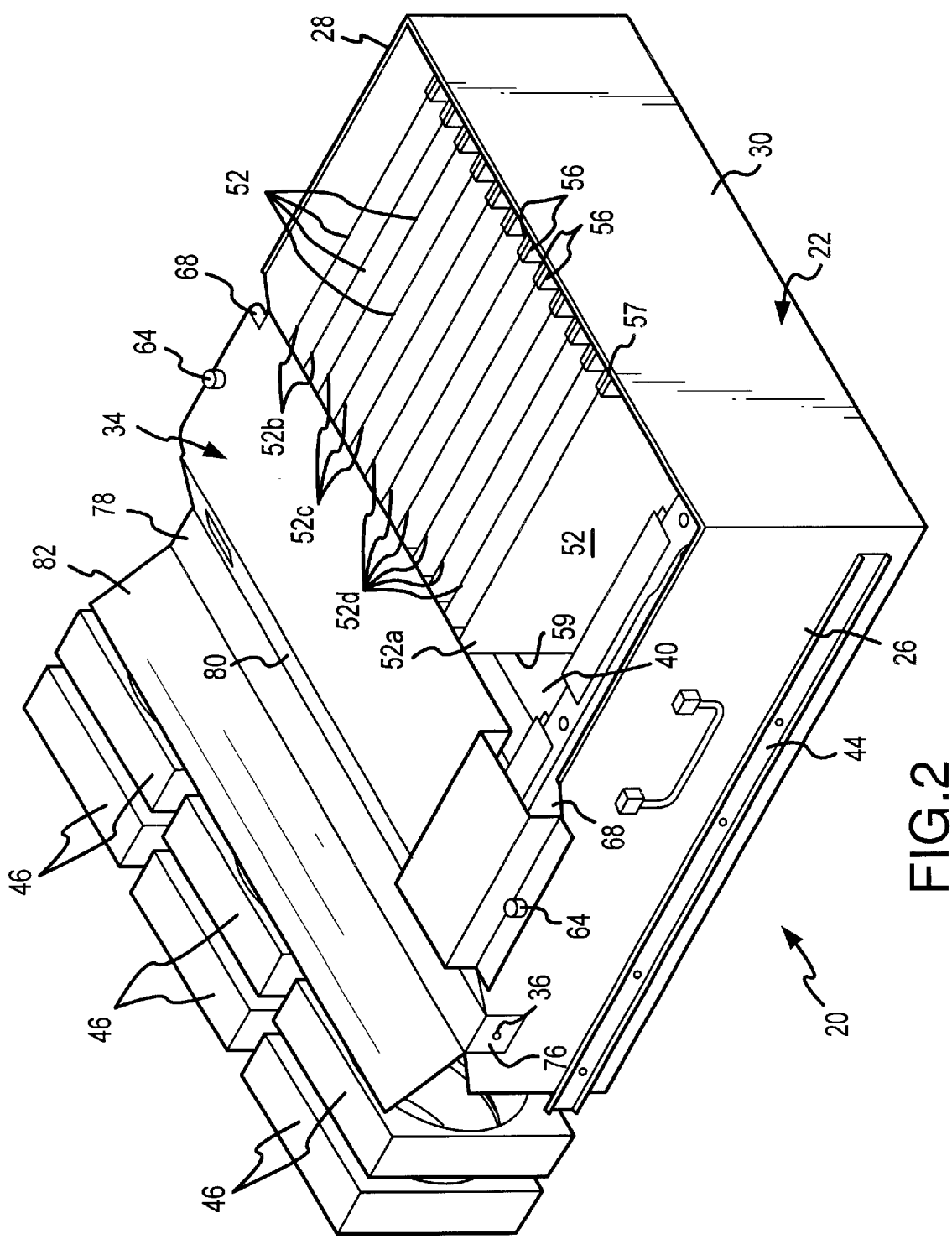
FIG. 2 is a perspective view of the electronic device shown in FIG. 1, with the retaining and air ducting plate shown in a closed position.

An electronic device 20, shown in FIGS. 1–4, incorporates the present invention. The electronic device 20 may be any type of electronic device, such as a network or computer server CPU unit which is shown in FIGS. 1–4. The electronic device 20 is preferably contained within a housing or cabinet in the form of a motherboard tray 22. The motherboard tray 22 includes a bottom wall 24 (FIG. 4) from which a pair of vertically extending side walls 26 and 28 extend upward. An end wall 30 also extends vertically upward from the bottom wall 24 and connects to vertical edges of the side walls 26 and 28. The motherboard tray 22 has an opening 32 (FIGS. 1 and 4) opposite of the end wall 30, where the bottom wall 24 and the side walls 26 and 28 terminate. A retaining and air ducting plate 34 is pivotally connected above the opening 32. Pivot pins or rivets 36 and 38 connect the retaining and air ducting plate 34 to the side walls 26 and 28, respectively, in a pivoting or hinge-like manner. The plate 34 pivots between and an open position (FIG. 1) and a closed position (FIG. 2). The bottom wall 24, the side walls 26 and 28, the end wall 30, and the retaining and air ducting plate 34 are preferably made of thin sheet metal.

A motherboard printed circuit board (PCB) 40 is retained within an interior of the main motherboard tray 22 defined by the side walls 26 and 28 and the end wall 30. Typically, the motherboard 40 is connected to the bottom wall 24 of the tray 22 by screws (not shown). When so connected, the motherboard 40 typically extends parallel to the bottom wall 24 and covers most of the surface area of the bottom wall 24. A conventional blind mate connector 42 is connected to an edge of the motherboard 40 at the opening 32. The blind mate connector 42 electrically connects with a corresponding conventional blind mate connector (not shown) of a conventional backplane PCB (also not shown) of a larger electronic device, for example a file server computer system, of which the electronic device 20 is a part. The connection of the blind mate connector 42 with the corresponding blind mate connector of the backplane PCB is achieved when the motherboard tray 22 is moved on slides 44 into a chassis which retains the backplane PCB in a position where its blind mate connector will connect with the blind mate connector 42 of the motherboard 40. The slides 44 are connected on the side walls 26 and 28 and extend generally parallel with the bottom wall 24. The slides 44 fit into rollers (not shown) attached to the chassis of the other device of which the electronic device 20 is a part. The opening 32 in the motherboard tray 22 allows the blind mate connectors of the motherboard 40 and the backplane PCB (not shown) to connect together.

The opening 32 also provides space for cooling air to flow into the interior of the motherboard tray 22 and over the electronic components connected to the motherboard 40. Air flow into the opening 32 of the motherboard tray 22 is caused by conventional cooling fans 46 which are attached to the chassis of the larger electronic device of which the electronic device 20 is a part. The cooling fans 46 are positioned adjacent to the opening 32 to blow air into the interior of the motherboard tray 22. The air enters the opening 32 and flows over the electronic components connected to the motherboard 40 and out the open top of the tray 22.

A variety of different types of conventional electronic components may be connected to the motherboard 40. For example, one or more processors 47 (FIGS. 1 and 4) may be connected to the motherboard 40 at a location adjoining the blind mate connector 42 at the edge of the motherboard in the opening 32. Each of the processors 47 typically has a heat sink 48 attached to it to dissipate the heat generated by the processor. With the processors 47 and their heat sinks 48 located in the opening 32, the air flow from the cooling fans 46 flows directly at the heat sinks 48 to achieve enhanced cooling.

The motherboard 40 also typically includes a plurality of conventional edge connectors 50, into which riser boards 52 may be inserted. Each of the edge connectors 50 is electrically and mechanically connected to the motherboard 40. Each of the riser boards 50 is similar to the exemplary riser board 52a which is shown in FIG. 1 in exploded relation to its edge connector 50a. Each edge connector 50 includes a plurality of resilient contacts (not specifically shown) which contact and press against contact pads 54 formed on a lower horizontal edge 55 of each riser board, as illustrated on the riser board 52a (FIG. 1). The resilient contacts of the edge connectors 50 allow the contact pads 54 of the lower horizontal edges 55 of the riser boards 52 to be inserted vertically downward into the edge connectors 50 to connect the riser boards 52 to the motherboard 40. The riser boards 52 may also be vertically separated from the edge connectors 50 to withdraw the riser boards from the edge connectors 50 and thereby remove the riser boards from the interior of the motherboard tray 22.

Vertically extending card guides 56 are attached to the end wall 30 to retain one vertically-extending edge 57 (FIG. 1) of each riser board 52 when the riser boards 52 are connected into their edge connectors 50. The vertically extending card guides 56 support the vertically-extending edge 57 to prevent lateral side-to-side movement of the riser boards 52 in a direction toward and away from the side walls 26 and 28. The card guides 56 are U-shaped cross-section to receive the vertically-extending edge 57 within the interior of the U-shaped configuration. When the contact pads 54 of the lower horizontal edge 55 are positioned within the edge connectors 50 and the vertically-extending edges 57 are positioned within the card guides 56, the riser boards 52 extend vertically, extend in a general perpendicular orientation relative to the motherboard 40, extend generally parallel to one another, and may extend generally perpendicularly with respect to the end wall 30 although such perpendicular orientation relative to the end wall 30 is not required.

Vertically-extending edges 59 (FIG. 1) of the riser boards 52, which are opposite from the edges 57 retained by the vertical card guides 56, are also retained against lateral side-o-side movement. The retaining and air ducting plate 34 includes a gasket 58 which contacts an upper horizontal edge 60 (FIG. 1) of each riser board 52, when the retaining and air ducting plate 34 is pivoted into the closed, retaining position shown in FIGS. 2, 3 and 4. The gasket 58 is preferably formed of a resilient compressible polyurethane or other foam or flexible material, such as PORON (registered trademark). In the closed position of the retaining and air ducting plate 34 shown in FIGS. 2–5, the material of the gasket 58 deforms against the upper horizontal edge 60 and contacts opposite lateral sides 61 (FIG. 5) of the upper horizontal edge 60 of the riser boards 52. The resilient deformation of the gasket 58 on opposite sides 61 of the upper edge 60 prevents the riser boards 52 from moving in the lateral side-to-side manner at the end opposite of the vertical edge 57 which is retained in the card guides 56. The resilient material of the gasket 58 and the retaining and air ducting plate 34 thereby retain the riser boards 52 to prevent lateral side-to-side movement as do the vertical card guides 56.

Moreover, the retaining and air ducting plate 34 and the gasket 58 also vertically retain the riser boards 52 to prevent them from vertically separating from the edge connectors 50. The gasket 58 is attached on the bottom surface of a horizontal portion 62 of the retaining and air ducting plate 34, and the gasket 58 applies a downward force on the upper horizontal edge 60 of the riser boards 52 to hold the riser boards in the vertical position connected to the edge connectors 50. Held in this manner, the connector pads 54 (FIG. 1) are prevented from vertically separating from the edge connectors 50. Holding the riser boards 52 against vertical separation from the edge connectors 50 is important in preventing the accidental electrical disconnection of the riser boards 52 from the motherboard 40 as might occur from vibrations and other jarring forces which are applied to the electronic device 20 when it is transported or used. Thus, in addition to retaining the ends of the riser boards 52 adjacent the vertically-extending edges 59 against the lateral side-to-side movement, the retaining and air ducting plate 34 also prevents the riser boards 50 from vertically disconnecting from the edge connectors 50.

The retaining and air ducting plate 34 also makes these advantages and improvements available for riser boards of a variety of different lengths. The length of each riser board is that dimension between its vertically extending edges 57 and 59 (FIG. 1). Because the gasket 58 applies downward resilient force on the upper horizontal edge 60 of each riser board 52 (FIG. 5), and does not contact the vertically-extending edge 59 of the riser board in the manner that the card guide 56 contacts the edge 57, there is no requirement that the riser boards 52 have predetermined length in order for the vertically-extending edge 59 to be retained against lateral side-to-side movement. Instead, riser boards of half-length and three fourth-length may be retained as effectively as full-length riser boards. The extent of the horizontal portion 62 of the plate 34 and the location of the gasket 58 on the horizontal portion 62 are selected to retain a variety of different lengths of riser boards. This improvement is illustrated in FIGS. 2–4, where full-length riser boards 52b, three fourth-length riser boards 52c and half-length riser boards 52a and 52d are all simultaneously retained against lateral side-to-side movement and vertical movement by the contact of the gasket 58 with the upper horizontal edges 60 of those riser boards.

Figure 3:
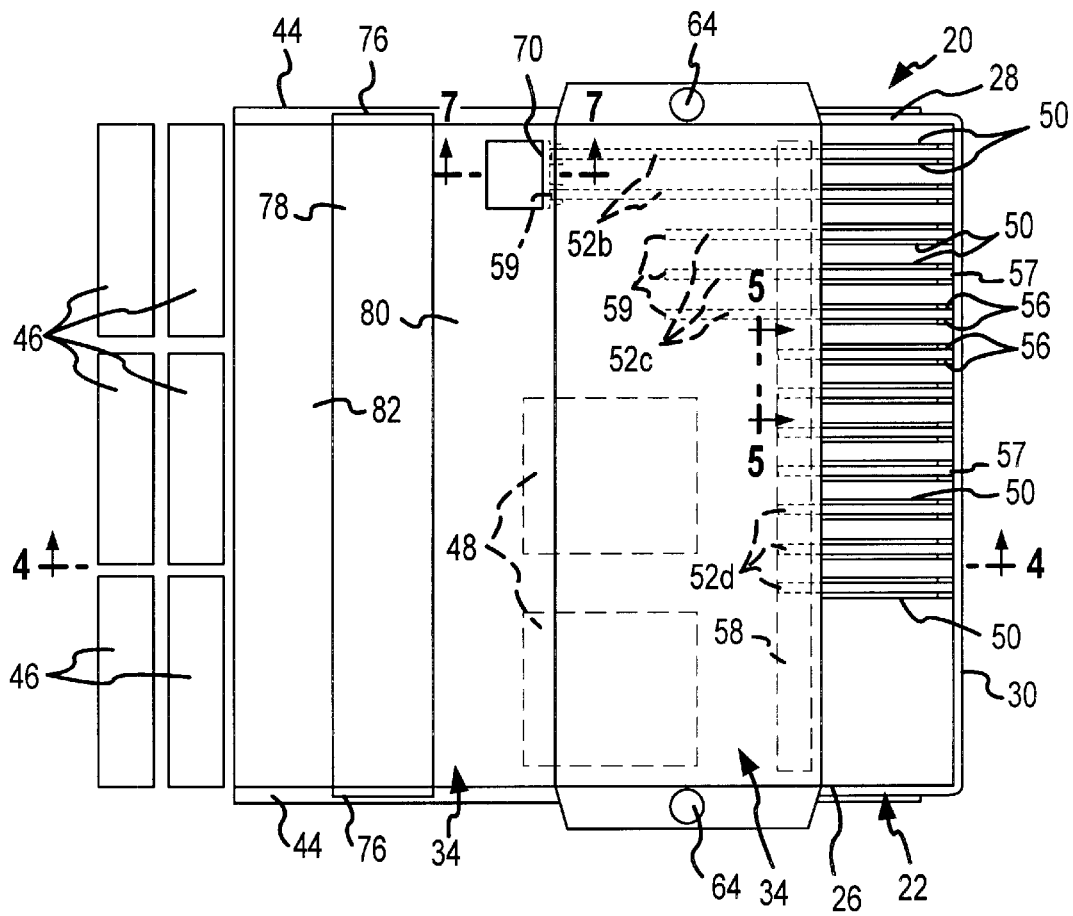
FIG. 3 is a top plan view of the electronic device shown in FIG. 2.
Figure 4:
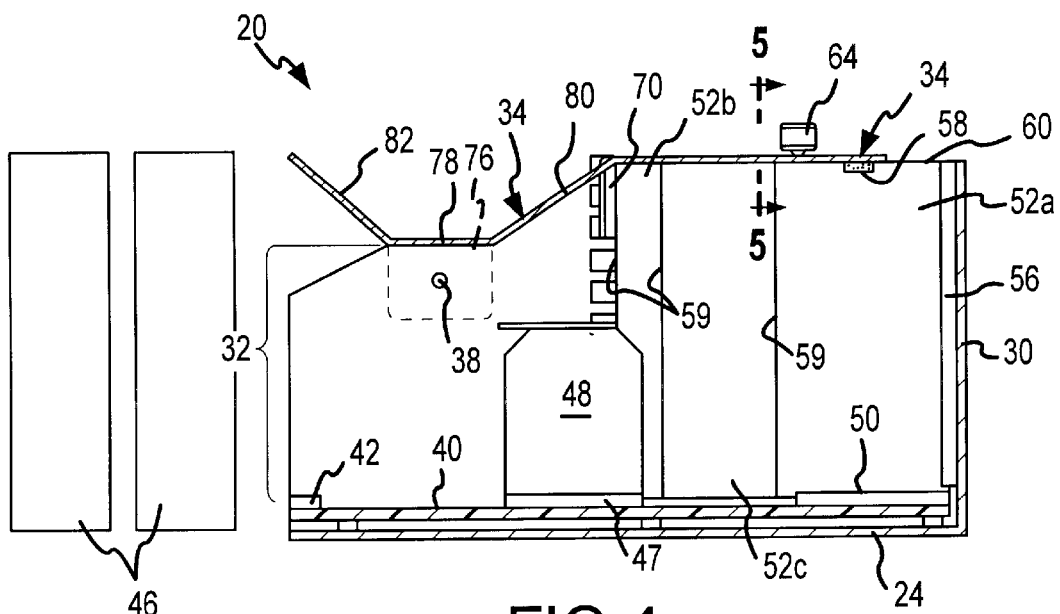
FIG. 4 is a section view of the electronic device shown in FIG. 2, taken substantially in the plane of line 4—4 of FIG. 3.
Figure 5:
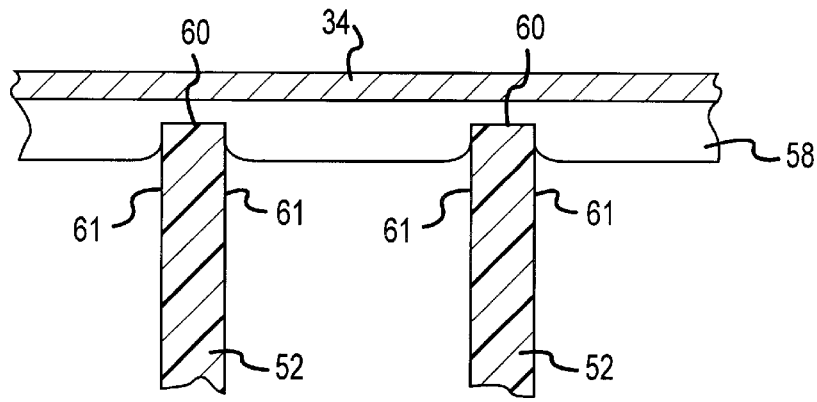
FIG. 5 is an enlarged partial sectional view taken substantially in the plane of line 5—5 of FIGS. 3 and 4.
Figure 6:
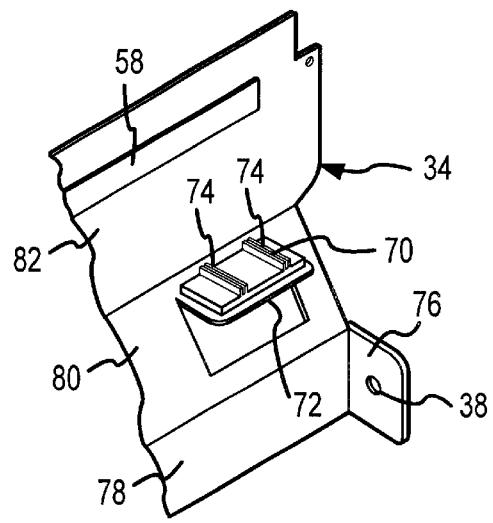
FIG. 6 is an enlarged partial view of a card edge guide of the retaining and air ducting plate shown in FIGS. 1–4.

The closed position of the retaining and air ducting plate 34 is maintained as shown in FIGS. 2–4 by thumb screws 64 located on laterally opposite sides of the retaining and air ducting plate 34. The thumb screws extend through the horizontal portion 62 and into threaded inserts 66 on flanges 68 of the side walls 24 and 26, as shown in FIG. 1. By tightening the thumb screws 64, the horizontal portion 62 is brought into firm contact with the flanges 68 to hold the retaining and air ducting plate 34 in the closed position shown in FIGS. 2–4. In the closed position, the retaining and air ducting plate 34 retains the riser boards 52 of the different lengths against lateral side-to-side movement and against vertical separation from the edge connectors 50, in the manner described.

Figure 7:
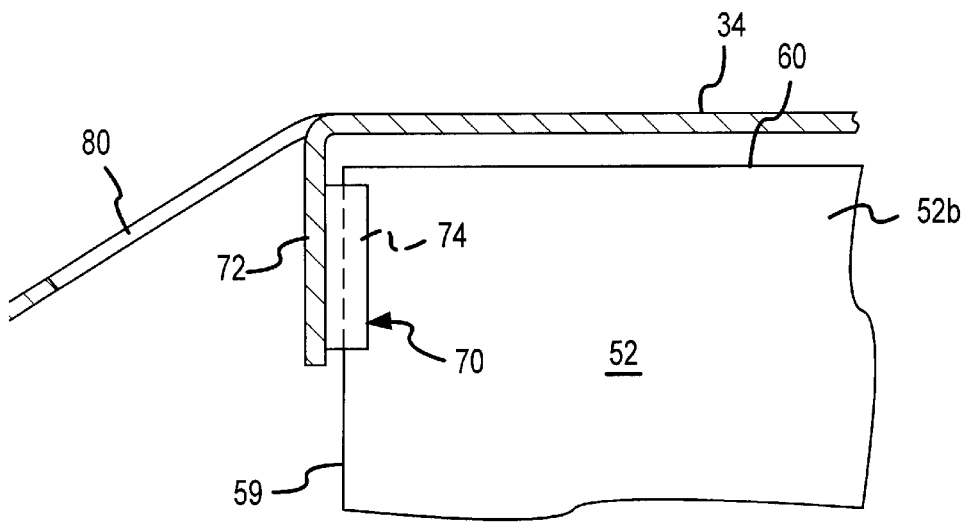
FIG. 7 is an enlarged partial side elevational view of the card edge guide shown in FIG. 6, taken substantially in the plane of line 7—7 of FIG. 3.

In addition to the retention capability of the retaining and air ducting plate 34 and the gasket 58, the vertical edges 59 of full-length riser boards 52b may be further retained against lateral side-to-side movement by a card edge guide 70 attached to the retaining and air ducting plate 34, as shown in FIGS. 1, 3, 4, 6 and 7. The card edge guide 70 is supported on a flange 72 which has been cut or punched from the sheet metal of the retaining and air ducting plate 34. The card edge guide 70 includes channels 74 into which the vertically-extending edges 59 of the full-length riser boards 52b fit when the retaining and air ducting plate 34 is in the closed position, as shown in FIG. 7. The channels 74 of the card edge guide 70 pivot into contact with the vertically-extending edges 59 of the full-length riser boards 52b when the retaining and air ducting plate 54 pivots into the closed position. The small vertical card edge guide 70 offers additional lateral side-to-side support for the full-length riser boards.

When the retaining and air ducting plate 34 is pivoted into the open position shown in FIG. 1, the pivot points at the pivot rivets 36 and 38 remove the horizontal portion 62 of the plate 34 away from the vertically-extending edges 59 of the riser boards. In the open position, the riser boards 52 can be vertically removed from the motherboard tray 22 without interference from the open retaining and air ducting plate 34. The pivot location of the retaining and air ducting plate 34 is separated from the edges 59 of the riser boards 52 to avoid interference with the riser boards during their removal and insertion.

The pivot or positioning structure of the retaining and air ducting plate 34 is established by flanges 76 on the opposite lateral sides of a center portion 78 of the plate, as shown in FIGS. 1, 2 and 3. The center portion 78 extends laterally between the side walls 26 and 28, and the flanges 76 are bent perpendicularly from the center portion 76 to extend parallel to the side walls 26 and 28. The flanges 76 are connected by the pivot rivets 36 and 38 to the side walls 26 and 28, respectively. The location of the pivot rivets 36 and 38 is separated from the vertical edges 59 of the riser boards, as shown in FIG. 4, so that the retaining and air ducting plate 34 pivots to the open position to avoid contact with the riser boards, as shown in FIG. 1 and as understood from FIG. 4. Other pivot structures can also be employed.

The pivot point at the rivets 36 and 38 is also vertically below the upper horizontal edges 60 of the riser boards, as is also shown in FIG. 4. Consequently, a transition portion 80 of the plate 34 extends from the center portion 78 upwardly and toward the end wall 30 to the upper horizontal portion 62 of the plate. A baffle portion 82 of the retaining and air ducting plate 34 extends from the center portion 78 in the opposite direction of the transition portion 80, as shown in FIGS. 2–4. The baffle portion 82 extends from the center portion 78 upwardly and away from the end wall 30. The baffle portion 82 provides an important improvement of increasing the cooling effect on certain heat-sensitive components attached to the motherboard 40.

The airflow from the cooling fans 46 encounters the baffle portion 82 and forces the cooling air flow downward along the baffle portion 82 toward the center portion 78. Because the baffle portion 82 and the center portion 78 extend laterally between the side walls 26 and 28, the cross-sectional area of the opening through which the cooling air must flow is reduced, as a result of the downward slope of the baffle portion 82 (taken with reference to the left-to-right cooling air flow from the fans 46, as shown in FIG. 4). The reduced the cross-sectional area of the opening 32 through which the cooling air flows causes the speed of that cooling air to increase in the opening 32. The increased speed of the cooling air achieves a greater heat transferring capability. Preferably the most heat-sensitive electrical components of the motherboard 40, such as the processors 47 and their attached heat sinks 48, are located generally below the center portion 78 of the plate 34, or slightly downstream (with respect to the cooling air flow) of the center portion 78, as shown in FIG. 4. Positioned in this location on the motherboard 40, the heat-sensitive components receive an increased airflow to achieve improved cooling.

The transition portion 80 of the plate 34 expands the space through which the cooling air flows, after the cooling air passes through the space 32 beneath the center portion 72. The transition portion 80 ducts the cooling air into the expanded cross-sectional area beneath the transition portion to cause the cooling air to slow and to flow more gently over the other less heat-sensitive electronic components attached to the motherboard 40, including the riser boards 52. The horizontal portion 62 of the plate 34 which connects to the transition portion 80 further ducts the cooling air horizontally along the riser boards 52.

The pivot point at the pivot rivets 36 and 38, the baffle portion 82, the center portion 78, the transition portion 80 and the horizontal portion 60 of the retaining and air ducting plate 34 thereby duct the cooling air to increase its velocity over the heat sensitive components and thereafter direct the cooling air over the riser boards 52 and the remaining electronic components of the motherboard 40.

The cooling air ducting capability to achieve an increased flow rate of the cooling air over the heat-sensitive components of the motherboard 40, and the lateral side-to-side and vertical retention of the riser boards, are significant improvements resulting from the retaining and air ducting plate 34 of the present invention. The retaining and air ducting improvements are available without regard to the length of the riser boards. These improvements are also achieved without impeding the access to the riser boards to allow them to be vertically inserted and removed when necessary. No special tools are required to insert, retain, disconnect or otherwise deal with the riser boards. Other significant improvements will be apparent upon a complete comprehension of the present invention. The terms "vertical" and "horizontal" have been used herein for convenience in describing relative relationships and not as absolute limitations.

A presently preferred embodiment of the present invention and many of its improvements have been described with a degree of particularity. This description is a preferred example of implementing the invention, and is not necessarily intended to limit the scope of the invention. The scope of the invention is defined by the following claims.

The invention claimed is:

1. A structure for retaining a vertically-extending riser printed circuit board connected to an edge connector of a horizontally-extending mother printed circuit board of an electronic device; the riser board including an upper horizontal edge, a lower horizontal edge which is connected to the edge connector, and two vertically-extending end edges which extend vertically between the upper and lower horizontal edges at the horizontal ends of the riser board; the structure comprising:

a plate having a horizontal portion;

a resilient compressible gasket attached to the horizontal portion of the plate;

an edge guide to contact a portion of one vertically-extending end edge of the riser board, the edge guide connected to and carried by the plate; and a positioning structure which locates the plate in a closed position relative to the riser board, the closed position locating the horizontal portion of the plate above a portion of the upper horizontal edge of the riser board to retain the riser board against vertical separation of the riser board from the motherboard, the closed position further resiliently compressing the gasket against the portion of the upper horizontal edge of the riser board to retain the riser board against lateral side-to-side movement, and the closed position further positioning the edge guide into contact with a portion of the vertically-extending end edge of the riser board.

2. A structure as defined in claim 1 wherein:

the positioning structure also locates the plate in an open position in which the horizontal portion of the plate and the gasket are laterally withdrawn to a non-interfering position which allows the riser board to be vertically inserted and removed from the edge connector.

3. A structure as defined in claim 1 wherein:

the resilient compressible gasket comprises foam material.

4. A structure as defined in claim 1 for retaining a plurality of said vertically-extending riser boards each of which is connected to an edge connector of the motherboard, each said riser board including an upper horizontal edge and a lower horizontal edge which is connected to the edge connector, at least two of the riser boards having different lengths in a horizontal dimension between one vertically-extending end edge and the other vertically-extending end edge, and wherein:

the horizontal portion of the plate extends above portions of the upper horizontal edges of the two riser boards of different lengths;

the positioning structure locates the plate in the closed position relative to the two riser boards of the different lengths to retain the two different-length riser boards against vertical separation of the lower horizontal edges from the edge connector, and the closed position further resiliently compresses the gasket against portions of the upper horizontal edges of the two different-length riser boards to retain the two different-length riser boards against lateral side-to-side movement; and the edge guide contacts a portion of the vertically-extending end edge of at least one of the two different-length riser boards.

5. A structure as defined in claim 1 wherein:

the positioning structure comprises a pivot structure which pivotally attaches the plate at location laterally separated from the riser board, the pivot structure pivoting the plate into a non-interfering open position in which the riser board can be vertically inserted into and removed from the edge connector; and the edge guide pivots with the plate into contact with the portion of the vertically-extending end edge of the riser board when the plate is pivoted into the closed position and pivots with the plate into a position of non-interference with the vertical movement of the riser board into and out of the edge connector when the plate is pivoted into the open position.

6. A structure as defined in claim 1 wherein:

the plate further includes a center portion and a transition portion which extends between the center portion and horizontal portion, the center portion is positioned vertically below the upper horizontal edge of the riser board, and the transition portion extends upwardly in the direction toward the riser board from the center portion to the horizontal portion, the center portion is positioned at a location laterally separated from the vertically-extending end edge of the riser board; and the edge guide is connected to the transition portion.

7. A structure as defined in claim 2 wherein:

the positioning structure comprises a pivot structure which pivotally attaches the plate at a location laterally separated from the riser board, the pivot structure pivoting the plate into the non-interfering open position and into the retaining closed position.

8. A structure as defined in claim 7 wherein:

the plate further includes a center portion, the center portion is pivotally connected at a location laterally separated from the riser board, the horizontal portion extends from the center portion in a direction toward the riser board, and the horizontal portion is laterally separated from a vertical movement path for inserting and removing the riser board from the edge connector when the plate pivots to the open position about the center portion.

9. A structure as defined in claim 8 used in conjunction with a fan for directing a cooling air flow over the motherboard and the riser board, wherein:

the plate further includes a transition portion which extends between the center portion and horizontal portion, the center portion is positioned vertically below the upper horizontal edge of the riser board, and the transition portion extends upwardly in the direction toward the riser board from the center portion to the horizontal portion;

a vertical dimension between the center portion and the motherboard defines a space through which the cooling air flows over the motherboard and the riser board; and the motherboard includes heat-sensitive electronic components which are located adjacent to the space defined between the center portion and the motherboard.

10. A structure as defined in claim 9 wherein:

the space between the center portion and the motherboard through which the cooling air flows is smaller in cross-sectional size than the cross-sectional size of a path through which the cooling air flows along sides of the riser board, the reduced cross-sectional size of the space between the center portion and the motherboard increases the speed of the cooling air flow over the heat-sensitive components of the motherboard.

11. A structure as defined in claim 10 wherein:

the plate further includes a baffle portion which extends from the center portion in the opposite direction of the horizontal portion, the baffle portion extends upwardly and horizontally into the cooling air flow to duct the cooling air flow into the flow path of reduced cross-sectional size as the cooling air flow enters into the space between the center portion and the motherboard.

12. A structure as defined in claim 11 wherein:

the transition portion of the plate ducts the cooling air flow from the space between the center portion and the motherboard into a flow path of increasing cross-sectional size as the cooling air flow leaves the space between the center portion and the motherboard to flow along sides of the riser board.

13. A structure as defined in claim 11 wherein:

the baffle portion is laterally separated from the vertical movement path for inserting and removing the riser board from the edge connector when the plate pivots to the open position about the center portion.

14. A structure as defined in claim 12 wherein:

the horizontal portion of the plate ducts the cooling air flow along sides of the riser board.

15. A structure as defined in claim 12 wherein:

the heat-sensitive components which have greater sensitivity to heat are connected to the motherboard at positions beneath the center portion and the transition portion of the plate when the plate is in the closed position.

16. A structure as defined in claim 4 further comprising:

a card guide connected to one vertically-extending end edge of each of the two riser boards of different lengths; and the positioning structure locates the plate and the gasket to resiliently compress the gasket around the portions of the upper horizontal edges of the two different-length riser boards adjacent to the vertically-extending end edges of the two different-length riser boards opposite from the end edges of the two different-length riser boards which are retained in the card guides.

17. A structure as defined in claim 16 wherein one of the two different-length riser boards is a full-length riser board, and wherein:

the edge guide contacts a portion of the vertically-extending end edge of the full-length riser board which is opposite of the vertically-extending end edge of the full-length riser board retained in the card guide when the plate is in the closed position.

18. A structure as defined in claim 17 wherein:

the positioning structure comprises a pivot structure which pivotally attaches the plate at location laterally separated from the plurality of riser boards, the pivot structure pivoting the plate into the retaining closed position and into the non-interfering open position in which the plurality of riser boards can be vertically inserted and removed from the edge connectors; and the edge guide is connected to the plate and pivots with the plate into contact with the portion of the vertically-extending end edge of the full-length riser board when the plate is pivoted into the closed position.

19. A structure as defined in claim 18 wherein:

the plate further includes a center portion and a transition portion which extends between the center portion and horizontal portion, the center portion is positioned vertically below the upper horizontal edges of the riser boards, and the transition portion extends upwardly in the direction toward the riser boards from the center portion to the horizontal portion, the center portion is pivotally connected at a location laterally separated from the vertically-extending end edges of the riser boards, the horizontal portion extends from the transition portion in a direction toward the riser board; and the edge guide is connected to the transition portion.

20. A structure for retaining a vertically-extending riser printed circuit board connected to an edge connector of a horizontally-extending mother printed circuit board of an electronic device; the riser board including an upper horizontal edge and a lower horizontal edge which is connected to the edge connector, and two vertically-extending end edges which extend vertically between the upper and lower horizontal edges at the horizontal ends of the riser board; the structure used with a fan for directing a cooling air flow in a path generally parallel to and over the motherboard and generally parallel to and along sides of the riser board; the motherboard including heat-sensitive electronic components which are attached to the motherboard and located at positions spaced horizontally upstream in the air flow path from the vertically-extending end edge of the riser board which leads when the air in the flow path encounters the riser board; the structure comprising:

a plate having a horizontal portion, a center portion and a transition portion extending between the center portion and the horizontal portion;

a positioning structure supporting the center portion at a location horizontally separated upstream in the air flow path from the vertically-extending leading end edge of the riser board and vertically above the heat-sensitive electronic components on the motherboard and below a level of the upper horizontal edge of the riser board;

the transition portion extending upwardly in the air flow path downstream from the center portion toward the leading edge of the riser board to the horizontal portion, and the horizontal portion extending from the transition portion in a direction above a portion of the horizontal edge of the riser board to retain the riser board against vertical separation of the riser board from the motherboard; and cooling air flows in the air flow path first through a space between the center portion and the motherboard and over the heat-sensitive components attached to the motherboard vertically below the center portion and then below the transition portion before encountering the leading edge of the riser board and lastly below the horizontal portion and along the sides of the riser board.

21. A structure as defined in claim 20 wherein:

the positioning structure also locates the plate in an open position in which the horizontal portion is withdrawn to a non-interfering position which allows the riser board to be vertically inserted and removed from the edge connector.

22. A structure as defined in claim 20 wherein:

the space between the center portion and the motherboard is smaller in cross-sectional size than the cross-sectional size of the path through which the cooling air flows along the sides of the riser board; and the reduced cross-sectional size of the path in the space between the center portion and the motherboard increases the speed of the cooling air flow over the heat-sensitive components of the motherboard at that location.

23. A structure as defined in claim 20 wherein:

the plate further includes a baffle portion which extends from the center portion in the opposite direction of the transition portion, the baffle portion extends upwardly and horizontally upstream into the cooling air flow path to duct the cooling air into a flow path of reduced cross-sectional size as the cooling air flow enters into the space between the center portion and the motherboard.

24. A structure as defined in claim 20 further comprising:

a resilient compressible gasket attached to the horizontal portion of the plate and which is resiliently compressed against a portion of the upper horizontal edge of the riser board to retain the riser board against lateral side-to-side movement.

25. A structure as defined in claim 20 for retaining a plurality of said vertically-extending riser boards each of which is connected to an edge connector of the motherboard, at least two of the riser boards having different lengths in a horizontal dimension between one vertically-extending end edge and the other vertically-extending end edge, and wherein:

the horizontal portion of the plate extends above portions of the upper horizontal edges of the two different-length riser boards; and the positioning structure locates the horizontal portion of the plate relative to the two different-length riser boards to retain the two different-length riser boards against vertical separation of the lower horizontal edges from the edge connector and against lateral side-to-side movement.

26. A structure as defined in claim 20 further comprising:

an edge guide connected to the transition portion of the plate to contact a portion of the vertically-extending leading end edge of the riser board; and wherein:

the positioning structure locates the edge guide into contact with the portion of the vertically-extending leading end edge of the riser board when the plate is in the closed position.

27. A structure as defined in claim 21 wherein:

the positioning structure includes a pivot structure which pivots the plate into the non-interfering open position and into a retaining closed position in which the horizontal portion is above the portion of the upper horizontal edge of the riser board.

28. A structure as defined in claim 23 wherein:

the transition portion of the plate ducts the cooling air from the reduced cross-sectional size of the space beneath the center portion and the motherboard into an increasing cross-sectional size flow path as the cooling air flow leaves the space between the center portion and the motherboard.

29. A structure as defined in claim 23 wherein:

the positioning structure also locates the plate in an open position in which the horizontal portion is withdrawn to a non-interfering position which allows the riser board to be vertically inserted and removed from the edge connector; and the baffle portion is separated from the vertical movement path for inserting and removing the riser board from the edge connector when the plate is positioned in the open position.

30. A structure as defined in claim 28 wherein:

the horizontal portion of the plate ducts the cooling air flow along sides of the riser board.

31. A structure as defined in claim 25 further comprising:

a card guide connected to one vertically-extending end edge of each of the two different-length riser boards; and a resilient compressible gasket attached to the horizontal portion of the plate and which is resiliently compressed against a portion of the upper horizontal edges of the two different-length riser boards adjacent to the vertically-extending end edges opposite from the end edges of the two different-length riser boards which are retained in the card guides.

32. A structure as defined in claim 31 wherein:

one of the two different-length riser boards is a full-length riser board;

the plate further includes an edge guide connected to contact a portion of the vertically-extending end edge of the full-length riser board which is opposite of the vertically-extending end edge of the full-length riser board retained in the card guide.

33. A structure as defined in claim 32 wherein:

the positioning structure locates the plate in a closed position as described and in an open position in which the horizontal portion is withdrawn to a non-interfering position which allows the riser board to be vertically inserted and removed from the edge connector; and the edge guide is connected to the plate and moves with the plate into contact with the portion of the vertically-extending leading end edge of the full-length riser board when the plate is moved into the closed position.

* * * * *